United States Patent [19]

Kimball et al.

[11] Patent Number: 4,739,274

[45] Date of Patent: Apr. 19, 1988

[54] DC GROUND FAULT DETECTION

[75] Inventors: Dorr Kimball, Alhambra; Michael G. Cox, Dominguez Hills; Manuel R. Cabison, San Gabriel, all of Calif.

[73] Assignee: Southern California Edison, Rosemead, Calif.

[21] Appl. No.: 773,333

[22] Filed: Sep. 6, 1985

[51] Int. Cl.[4] ..................... G01R 31/08; G01R 33/00
[52] U.S. Cl. .................... 324/529; 324/520; 340/650
[58] Field of Search ............... 340/644–651; 324/51, 52, 117 H, 133, 529, 520

[56] References Cited

U.S. PATENT DOCUMENTS

| 383,666 | 5/1888 | Shallenberger | 340/650 |
|---|---|---|---|
| 405,572 | 6/1889 | Loomis | 340/650 |
| 428,050 | 5/1890 | Macloskie | 340/650 |
| 1,538,383 | 5/1925 | Bullard . | |
| 2,989,694 | 6/1961 | Fath | 340/650 |
| 3,800,214 | 3/1974 | O'Flynn . | |
| 3,991,363 | 11/1976 | Lathrop . | |
| 4,104,581 | 8/1978 | Arkosy . | |
| 4,151,460 | 4/1979 | Seese . | |
| 4,227,145 | 10/1980 | Bonikowski et al. . | |
| 4,395,677 | 7/1983 | Petersdorf | 324/117 H |
| 4,406,985 | 9/1983 | Phillips . | |
| 4,415,779 | 11/1983 | Bowman . | |
| 4,415,850 | 11/1983 | Sherwood . | |
| 4,417,202 | 11/1983 | Pascoe | 340/650 |
| 4,471,293 | 9/1984 | Schnack . | |

FOREIGN PATENT DOCUMENTS 1272567 4/1902 France .
58-83731 11/1984 Japan .
100985 10/1962 Norway .

OTHER PUBLICATIONS

Loewe: "Check That Ground"-Allis Chalmers Tech. Review-2nd Quarter 1948-4 pages.
Edwards: "A Combined Voltage and Earth Indicator . . ."-Electronic Engineering-Jan. 1965-pp. 34-35.
Undated literature of TIF Instruments Inc. (p. 21; pp. 48, 49, 50 and 51).

Primary Examiner—Reinhard J. Eisenzopf
Assistant Examiner—Jose M. Solis
Attorney, Agent, or Firm—Sheldon & Mak

[57] ABSTRACT

Apparatus for the detection of ground leakage in a normally ungrounded DC system includes a DC power supply and conductors from the supply for supplying power to a load connected to the DC system. There is an indicator connected between the DC system and a ground point such that a ground leakage in the system closes a circuit to activate the indicator. With such activation, a pulser periodically interrupts the circuit to effectively generate an interrupted ground fault signal. Such signal is detected by a sensor located relative to the DC system such that an interrupted ground signal detected by the sensor locates the ground fault. Noise introduced into the pulse signal by the periodic interruption of the circuit during the ground fault occurrence is suppressed by the sensor means.

24 Claims, 3 Drawing Sheets

DC GROUND FAULT DETECTION

BACKGROUND OF THE INVENTION

This invention relates to the detection of DC ground faults. In particular it relates to an apparatus and a method for detecting such faults in normally ungrounded DC distribution systems having significant capacitive reactance components and strong electromagnetic and electrostatic fields associated with utility power generation and distribution, industrial plants, and computer/electronic systems, where ground faults must be located without taking unaffected equipment out of service.

A basic problem is such systems is the need to identify small DC fault currents namely low to high impedance ground faults in the presence of much larger DC load currents.

One well-known ground detection circuit consists of a center tapped high resistance connected across the DC source and an indicating milliammeter between the center tap and ground. A ground fault anywhere on the DC system causes an indication on the milliammeter. Since the high resistance limits the ground fault current to a few milliamperes the circuit is not tripped off when a fault occurs. This is important since loss of power on a typical DC control circuit is often critical and could involve safety hazards. It is important to locate and repair any ground faults as soon as practical since a second ground fault would trip the circuit.

Such a ground detection system while indicating that a ground fault has occurred does not tell where the fault lies. It could be in any one of many pieces of equipment on numerous branch circuits. Again because of the critical nature of these circuits it is not practical to turn them off one at a time to locate the fault. Thus a system is needed to locate the faulty equipment without interrupting these critical circuits.

Another system for DC fault detection requires the introduction into a DC fault line of an AC current at a frequency of about 25 Hz, which is then detected. A problem with the introduction of such AC current is that it is liable to cause operational problems, mask some faults, and create complications in detecting and localizing ground faults in some DC loads in the system.

It is also known elsewhere to test for DC faults in small systems employing grounded 12-volt battery type power supplies in automobiles and the like. Such grounded DC systems require the connection of an injector across terminals of the battery supply and thereafter a detector is applied over the wiring system with sound detection means such that an increasing sound would indicate where a DC fault exists.

Such systems operate in response to high DC fault currents in an environment where there is no capacitive or inductive reatances of consequence, or where they are of no real concern and where the DC system is effectively shut off when the fault detection is being made.

It is also known in AC systems to detect ground leakage by a relay which interrupts the system so as to indroduce a fault current in the sense of a pulsating input. Such systems however are of a nature that a D'Arsonval type meter or permanent magnet moving coil meter are used for detection of the pulsating input. Such a meter requires a current transformer suitable for detecting relatively large AC fault currents, and this is unsuitable for measuring pulsating DC fault currents of a lower value. These detection systems are particularly unsuitable in high electrostatic and electromagnetic environments.

SUMMARY OF THE INVENTION

According to the invention there is provided apparatus for the detection of ground leakage in a normally ungrounded DC distribution system which includes a DC power supply and conductors from the supply for supplying power to load means connected to the DC distribution system. There is tapping point between resistor means connected across the DC power supply and a responsive means such as indicator means connected between the tapping point and a ground point such that a ground leakage in the system complete a circuit to activate the indicator means. With such ground leakage activation, there are means adapted to interrupt periodically the circuit to effectively generate an interrupted ground fault signal. Such signal is detected by either a permanently located and/or portable sensor or means located relative to the DC system such that a pulse interrupted ground signal can be detected by the sensor means and thereby the ground fault located in the DC system.

The sensor means includes means to suppress noise introduced into the pulse signal by the periodic interruption of the circuit during the ground fault occurrence, and also includes means to eliminate the effects of distributed capacitive and inductive reactance.

DETAILED DESCRIPTION OF THE DRAWINGS

Figure 1:
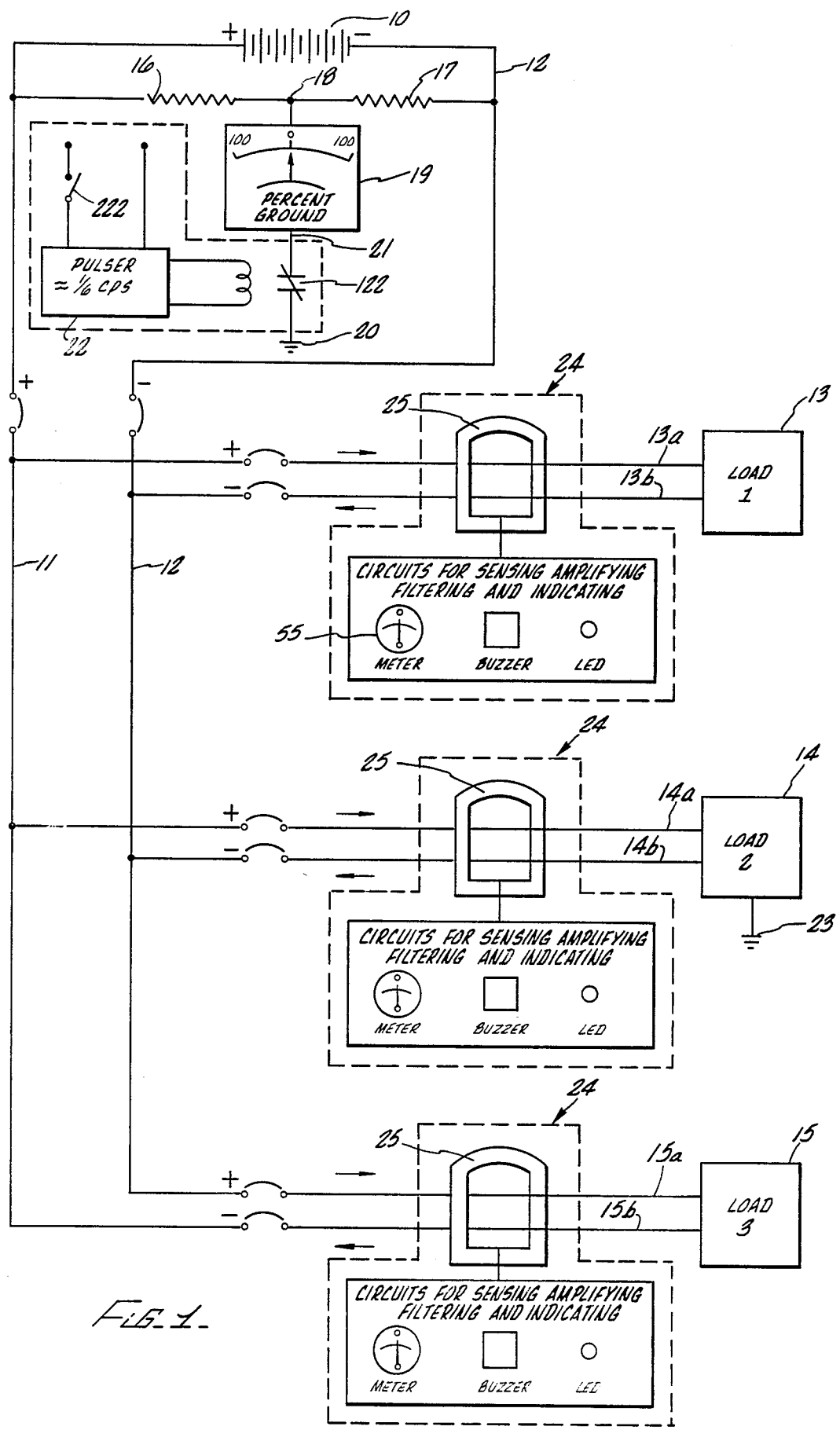
FIG. 1 is a block diagram illustrating a DC system with various loads, and in which a ground fault is present in one of the loads, including sensor means for sensing such fault.

Apparatus for the detection of ground leakage in a normally ungrounded DC system comprises a DC power battery supply 10. Main bus bars 11 and 12 from the battery supply 10 supply power to different loads 13, 14 and 15 in this exemplary embodiment. Conductors 13a and 13b from main bus bars 11 and 12 connect with load 13. Similarly, the main bus bars 11 and 12 are connected to load 14 through conductors 14a and 14b. There are conductors 15a and 15b to load 15.

Across the bus bars or conductors 11 and 12 are resistors 16 and 17 and between these resistors 16 and 17 is a tapping point 18. A responsive element in the form of ground indicator meter 19 is connected between the tapping point 18 and a ground point 20 such that a ground fault leakage in the system closes a ground circuit to activate the indicator meter 19. In the conductor 21 connecting the indicator means 19 to a ground point 20 there is located a reed realy 122 operable by a pulser 22 to open and close the relay 122 at approximately one cycle every 6 seconds. In this fashion a DC pulsing fault current is generated into the ground circuit and thereby an interrupted ground fault signal is obtained.

The remainder of the ground circuit is constituted through the bus bars 11 and 12 and conductors 14a and 14b to load 14 which is indicated to have a ground fault 23. In the exemplary embodiment loads 13 and 15 do not have such ground fault.

The relay 122 is normally closed. The pulser 22 is incorporated in a circuit with a normally open switch 222 for selectively activating said pulser 22 to operate said relay 122. Closure of switch 222 can be manually effected or be by electromechanical means on the occurrence of a ground fault condition.

In the one example of the invention, for each load circuit 13, 14 and 15 there is provided a sensor 24 respectively. Such sensor 24 includes a Hall effect sensing element 25 together with detection circuit 125 to indicate whether a pulsating ground signal is sensed by the Hall effect element 24 in a particular conducting line 13a, 13b, 14a, 14b, 15a or 15b respectively.

The pulser 22 is not placed into circuit until such time as the ground fault indicator 19 detects the existence of a ground fault current in the embodiment described. In some cases, however, the indicator 19 may be dispensed with, or the pulser 22 continually applied irrespective of the indicator 19 such that any permanently located sensor 24 will indicate a fault current.

Figure 2:
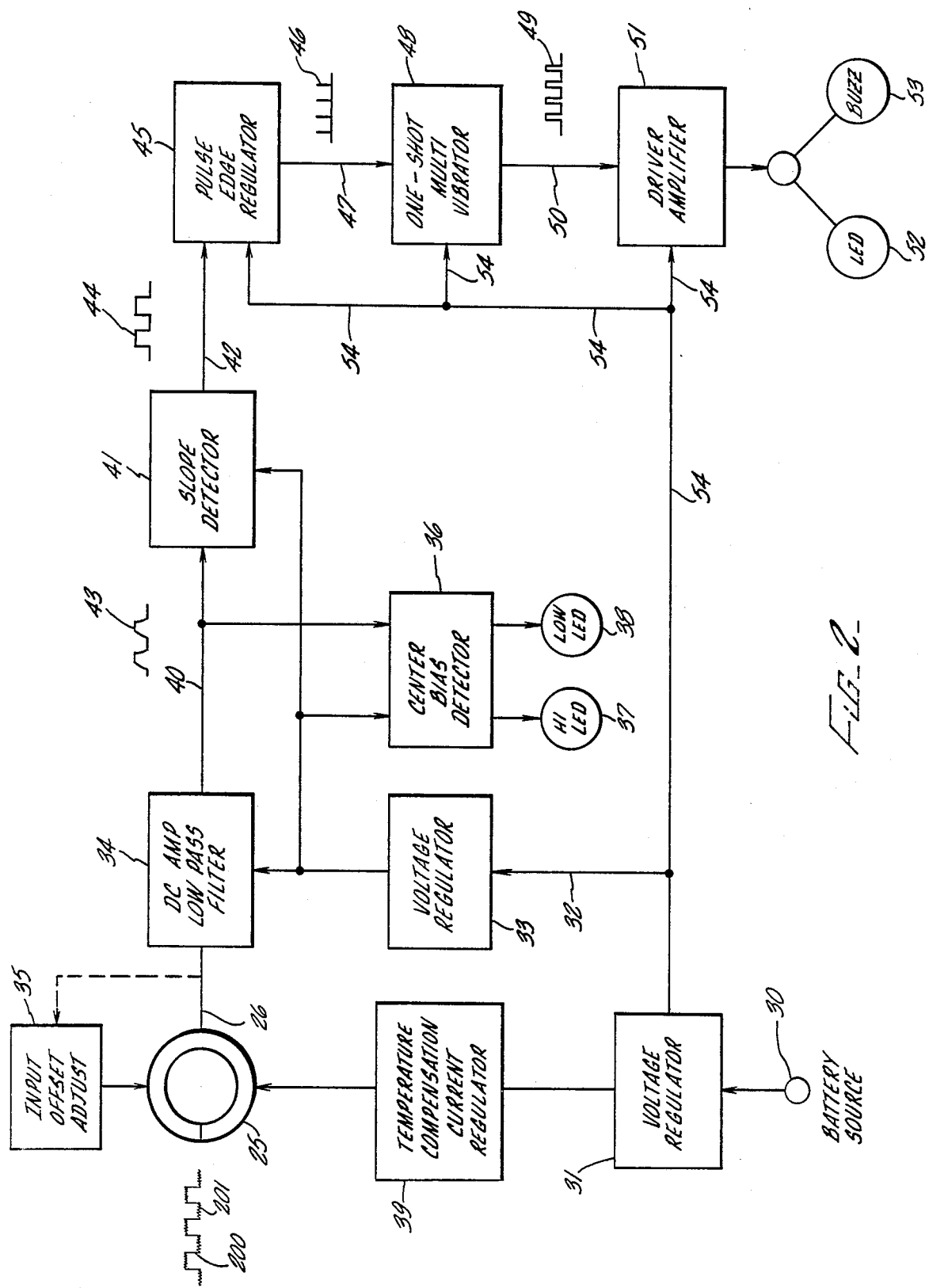
FIG. 2 is a block diagram schematic of the sensor means for detecting interrupted ground fault signals.

The sensor 24 for detecting interrupted ground fault signals as illustrated in block diagram of FIG. 2, includes a Hall effect sensing element 25 which receives both a composite pulse signal 200 with superimposed noise 201 which is fed from the Hall effect sensor 25 along conductor 26. The signal is received from the pulser 22 in the form of a one-sixth (1/6) Hertz square wave 200.

The power supply to the sensor 24 includes a battery source 30 which is normally a small DC volt supply. This supply 30 is passed through a first voltage regulator 31 which detects variations of the battery supply, for instance, a decrease of the battery voltage over a time period. The battery voltage sample is passed along line 32 to a second voltage regulator 33.

The first voltage regulator 31 stabilizes the battery voltage supply to the overall circuit and makes it possible for the circuit to operate from 6.5 volts to 15 volts. The second voltage regulator 33 delivers a very stable voltage supply to a DC amplifier and low pass filter 34. Combined with the voltage regulator 31 the voltage regulation is within ±0.02% and this eliminates the spurious injection of transients to the DC amplifier 34.

The DC amplifier and low pass filter 34 amplify the signal transmitted along conductor 26 from the Hall effect sensor 25 and passes only those frequencies that are 5 Hertz or less. For proper operation, the output voltage range of the DC amplifier is within 0.75 volts to 2.75 volts.

Associated with the Hall effect sensor 25 is an input offset adjustment element 35 which permits for the manual adjustment to bring the output level of the Hall effect sensor 25 to a value suitable for operation of the DC amplifier 34.

In order to ensure that the DC amplifier output voltage is in the appropriate range there is provided a center biased detector 36 with visual indicator means 37 and 38 respectively indicating whether the DC amplifier is set to operate in its proper range. With the visual indicator 37, namely, the hi-LED lit-up there is indicated that the DC amplifier output is greater than 2.75 volts. With the indicator 38, namely, the "low-LED" lit-up there is indicated that the DC amplifier 34 output is less than 0.75 volts. Thus, when both the indicators 37 and 38 are in the "off" state the DC amplifier 34 is correctly set up.

Also located between the voltage regulator 31 and Hall effect sensing element 25 is a temperature compensating current regulator 39 which provides a constant 20 mA current to the Hall effect sensor 25 for control of the current requirements.

The output from the DC amplifier and low pass filter 34 is passed along conductor 40 to a slope detector 41. The output from the detector along line 42 changes from a high to low or low to high state when the output wave form 43 from the DC amplifier low pass filter 34 changes at a rate of 5 mV per second or more from the point of inflection of the wave form curve.

The pulse type square wave output 44 from the slope detector 41 is fed by conductor 42 to a pulse edge detector 45. The detector 45 outputs along line 47 a positive spike 46 for every rise or fall edge of the slope detector output wave form 44. The output spike wave form 46 which is fed along conductor 47 to a one shot multivibrator 48 which outputs a 0.6 second duration pulse, for every pulse from the pulse edge detector 45. The one-shot multivibrator 48 outputs this pulse 49 along the output conductor 50 which feeds a driver amplifier 51. The amplifier 51 operates either an LED indicator 52 or buzzer 53 to provide a visual or audio means of recognizing the existence of a fault.

The voltage regulator 31 is also connected along line 54 with the drive amplifier 51, the one-shot multivibrator 48 and the pulse edge detector 45. Alternatively, to a LED 52 or buzzer 53 there can be a meter 55 operated by the driver amplifier 51 as indicated in FIG. 1.

Figure 3:
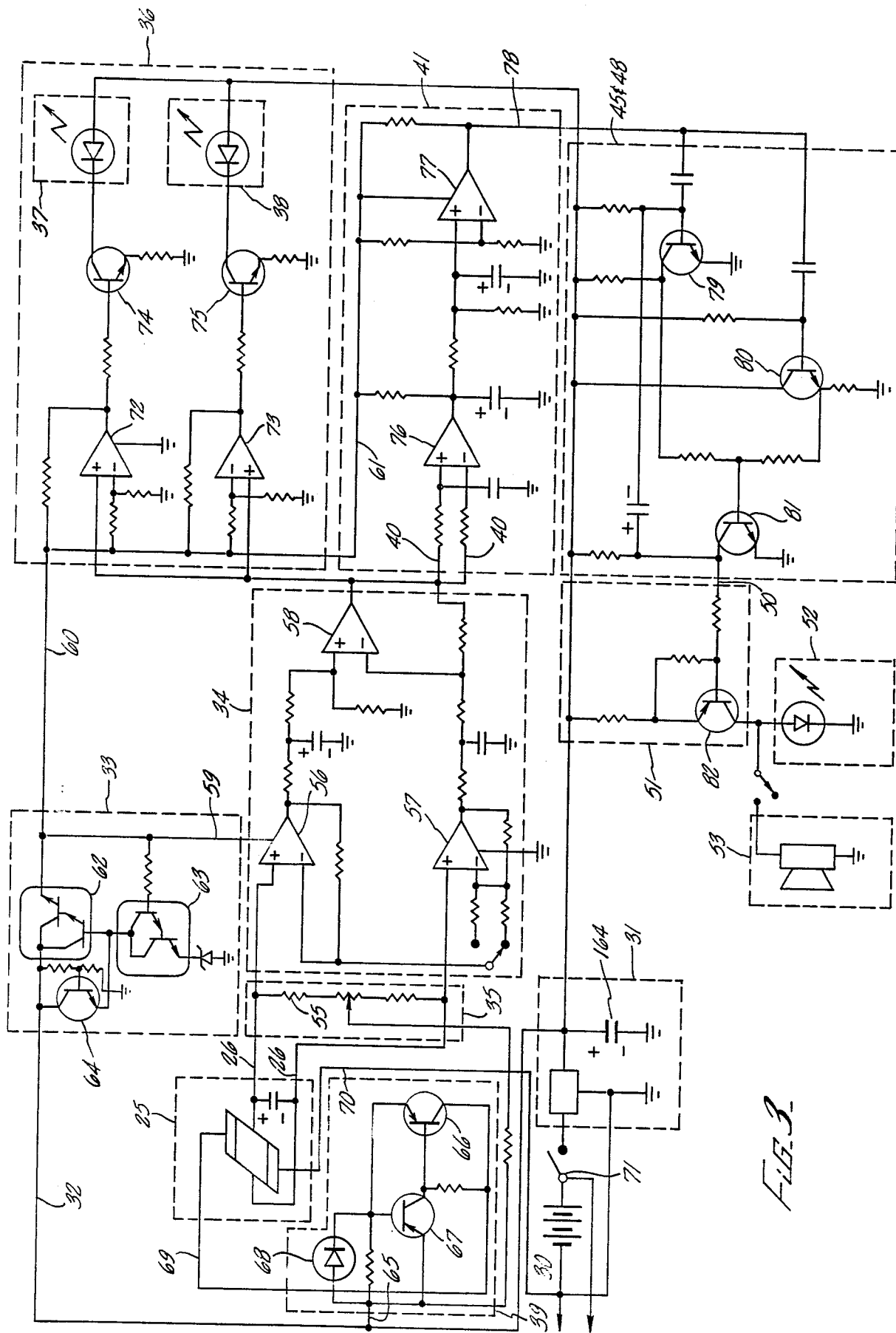
FIG. 3 is a detailed schematic of the sensor means of FIG. 2.

FIG. 3 discloses in more detail the circuitry constituting the sensor illustrated in the block diagram of FIG. 2. The Hall sensor device 25 is shown connected through conductor 26 via an input offset adjust constituted by a variable resistor bank 55 to the IC elements 56 and 57 the output of which is in turn connected with the IC 58 to constitute an amplifier and a low pass filter.

The voltage regulator 33 is connected to the amplifiers by line 59 and to the center bias detector 36 along line 60 and to the slope detector by line 61.

The voltage regulator 33 consists of several transistor cofigurations 62, 63, and 64 arranged in voltage regulating fashion.

The voltage regulator 31 includes a capacitor 64, the positive side of which is connected through line 65 with the temperature compensating current regulator which includes an array of transistor 66 and 67 and diode 68 suitably arranged.

The output of the current regulator 39 is connected by conductors 69 and 70 to the Hall effect sensing device 25.

Between the battery 30 and the voltage regulator 31 is a manually operable switch 71 to activate the sensor 24 as desired.

The center bias detector 36 includes a pair of IC elements 72 and 73 respectively, the outputs of which are connected to transistors 74 and 75 respectively to in turn drive the LED's 37 and 38.

The slope detector 41 receives a signal from the DC amplifier and low pass filter along the conductors 40 which is then passed through a first IC element 76 and the output in turn to an IC element 77. The output from IC 77 passes along line 78 to the pulse edge detector 45 and multivibrator 48 along line 78. The pulse edge detector and multivibrator are constituted by the array of transistors 79, 80, and 81 suitable arranged. The output from the multivibrator transistor 81 passes along line 50 to the driver amplifier circuit constituted by a transistor 82 which itself is arranged to drive either the buzzer 53 or LED 52 as necessary.

In operation of the DC fault detector the procedure is that the fault is first verified as existing in the system by observing the indicator 19 located between the tapping point 18 and ground 20. This indicator 19 as a percent ground would indicate that a fault exists and should this be sufficiently large then a resistive fault current would be indicated. The pulser 22 is then turned on by closing the switch 222.

The Hall clamp-on sensing devices 24 as currently available are sensitive to a fault current of at least 4 milliamps. More sensitive devices, however, could be available.

The sensing elements 25 are clamped over the conductors 13A, 13B, 14A, 14B, 15A and 15B respectively after verifying with the percent ground meter 19 that the fault current is sufficiently large enough to detect. Thereupon the input offset adjust 35 and center bias detector 36 are adjusted so as to effectively render the sensor 24 operational.

The isolation of the detector fault current to the branch circuit 13A, 13B, or 14A, 14B, or 15A, 15B is determined by a response to the pulsed input signal by either the LED 52, buzzer 53 or meter 55 which constitutes the indicator means of the sensor 24 in the respective branch having a ground fault.

In the example illustrated the response will be in the branch line 14A, 14B in view of the ground fault 23. The sensor 24 will in that circuit pass interrupted ground fault current as generated by the pulser 22 through the reed relay 122 which is opened and closed in the ground circuit. Accordingly, the indicator in the sensor 24 will respond. In those circuits where there is no ground fault there will be no indicator response or an irregular response in the sensor 24. The indicator response in sensor 24 for a resistor fault output would be regularly indicated at about 3 second intervals.

By moving the sensor 24 along the conductors 14A and 14B to a point where the ground fault signal ceases to be detected by the sensor it has provided a means for detecting the actual location of the ground fault. The detector in fact need be placed only about either conductor 14A or 14B to locate more precisely the location of the fault.

I some embodiments of the invention sensors can be permanently located at discreet points. Moreover, a pulser can also permanently be in circuit such that on the occurrence of a ground fault one or more sensors will respond enabling the location of the ground fault. Essentially, the apparatus and method of the invention ensure that the normally ungrounded DC system can remain operational in respect of the ungrounded loads and this prevents expensive and unnecessary down time for systems which must continue operation while others suffer ground fault problems and during detection of those problems.

Many changes and variations may be made in the apparatus and method providing widely different embodiments in applications for this invention without departing from the scope thereof. All matter contained in the above description as shown in the accompanying drawings shall be interpreted as illustrative but not limiting, the invention being interpreted solely by the scope of the appended clams.

We claim:

1. Apparatus for the detection of low level ground leakage current in a normally ungrounded DC system in a multifeeder distribution system having a relatively high capacitive reactance and being associated with a relatively strong electromagnetic and electrostatic field, said system including a DC power supply, conductors from the supply for supplying power to a load connected in the DC system comprising a resistor element for connection across the DC power supply, a tapping point to the resistor element, a connector between the tapping point and a ground point such that a ground leakage current in the system completes a ground circuit, a normally closed relay between the tapping point and ground, a pulser for periodically opening and closing said relay while the ungrounded DC system remains substantially closed and operational, the opening and closing of said relay interrupting said ground circuit effectively thereby to generate a DC pulse interrupted ground fault signal and a magnetic sensor for location relative to the DC system for sensing said magnetic field changes and thereby said DC pulse interrupted ground fault signal and thereby providing for detecting the location of the low level ground leakage current in the relatively high capacitive reactance system, said DC system remaining substantially closed and operational during the ground leakage current detection, the pulse interruption rate being between about 2 to about 6 cycles per second.

2. Apparatus as claimed in claim 1, wherein said sensor includes at least one of a meter indicator, LED display or sound indicator and said sensor indicates a presence of said pulse interrupted ground fault signal by said meter indicator, LED display or sound indicator.

3. Apparatus as claimed in either of claims 1 or 2, including electronic signal conditioning means for reducing noise generated by the pulser and relay.

4. Apparatus as claimed in claim 3, including a signal pick-up element, and wherein the electronic signal conditioning means includes a DC amplifier and a low pass filter and means for biasing the output of the DC amplifier between a selected voltage range.

5. Apparatus as claimed in claim 4, including a DC battery source for the sensor, and means for minimizing DC battery voltage variation effects on said sensor.

6. Apparatus as claimed in claim 5 wherein the means for minimizing DC battery voltage variation includes a first voltage regulator to detect variations in battery supply voltage, and a second voltage regulator to minimize transients.

7. Apparatus as claimed in claim 5, wherein the pick up element includes a Hall effect sensing element for physical relationship about at least one conductor in the DC system.

8. Apparatus claimed in claim 6 including a switch in circuit with said pulser, said switch being normally open and being operative to closure thereby to activate the pulser.

9. Apparatus as claimed in claim 5 wherein the pulser signal is substantially a square wave with a period of substantially 6 seconds.

10. Apparatus for the detection of low level ground leakage current in a normally ungrounded DC system in a distribution system having a relatively high capacitive reactance, including a DC power supply, conductors from the supply for supplying power to a load connected in the DC system comprising a resistor element for connection across the DC power supply, a tapping point to the resistor element, a responsive element connected between the tapping point and a ground point such that a ground leakage current in the system completes a ground circuit to activate the responsive element, a relay between the responsive element and ground pulser for periodically opening and closing said relay, while the ungrounded DC system remains operational, the opening and closing of said relay interrupting said ground circuit effectively to generate a DC pulse interrupted ground fault signal to produce proportional periodic changes in a magnetic field associated with the system, said pulser being incorporated in a circuit with a normally open switch, whereby on the occurrence of a ground fault condition, said pulser operates said relay, and a magnetic sensor for location relative the DC system for sensing said magnetic field changes and thereby said DC pulse interrupted ground fault signal whereby solely said interrupted ground fault signal provides the necessary signal for the low level ground fault current in the relatively high capacitive reactance system detection, and including electronic signal and conditioning means for reducing noise generated by the pulser and relay wherein said conditioning means includes an amplifier and filter for the noise, the pulse interruption rate being between about 2 to about 6 cycles per second.

11. Apparatus as claimed in claim 10, wherein the responsive element is a ground indicator meter.

12. A method of detecting low level ground leakage current in a normally ungrounded DC system in a multifeeder distribution system having a relatively high capacitive reactance and being associated with a relatively strong electromagnetic and electrostatic field, said system including a DC power supply, conductors from the supply for supplying power to a load connected in the DC system comprising the steps of connecting a resistor across the DC power supply, connecting an indicator between a tapping point relative to the resistor and a ground point such that a ground leakage current in the system closes a ground circuit to activate the indicator means, periodically interrupting said circuit by opening and closing the ground circuit effectively to generate a DC pulse interrupted ground fault signal to produce proportional periodic changes in a magnetic field associated with the system while the ungrounded DC system remains substantially operational, and magnetically sensing in a location relative the DC system said magnetic field changes related to said pulse interrupted ground fault signal whereby said magnetic field changes provide the necessary signal for low level ground fault current detection, the pulse interruption rate being between about 2 to about 6 cycles per second.

13. A method as claimed in claim 12, including closing a switch to a pulser whereby the pulser effectively signals the opening and closing of a relay thereby to generate said pulse interrupted ground fault signal.

14. A method as claimed in claim 13, including filtering from the sensor noise generated by the signal interruption.

15. Apparatus as claimed in claim 3 wherein the indicator response in the sensor is indicated at about 3 second intervals.

16. Apparatus as claimed in claim 3 wherein the magnetic sensor is responsive to a leakage current of about 4 milliamps.

17. Apparatus as claimed in claim 3 wherein the magnetic sensor is responsive to a leakage current of less than about 4 milliamps.

18. Apparatus as claimed in claim 10 wherein the DC pulse interrupted ground fault signal has a period of at least about 6 seconds and wherein the magnetic sensor is responsive to a leakage current of less than about 4 milliamps.

19. A method as claimed in claim 12 wherein the sensor responds to magnetic field changes at intervals of about 3 seconds.

20. A method as claimed in claim 12 wherein the magnetic sensor is responsive to a leakage current of at least less than about 4 milliamps.

21. Apparatus as claimed in claim 3 wherein the sensor is permanently located relative to the DC system.

22. A method as claimed in claim 12 including permanently locating the sensor relative to the DC system.

23. Apparatus for the detection of low level ground leakage current in a normally ungrounded DC system in a multifeeder distribution system having a relatively high capacitive reactance and being associated with a relatively strong electromagnetic and electrostatic field, said system including a DC power supply, conductors from the supply for supplying power to a load connected in the DC system comprising a resistor element for connection across the DC power supply, a tapping point to the resistor element, a connector between the tapping point and a ground point such that a ground leakage current in the system completes a ground circuit, a normally closed relay between the tapping point and ground, a pulser for periodically opening and closing said relay while the ungrounded DC system remains substantially closed and operational, the opening and closing of said relay interrupting said ground circuit effectively thereby to generate a DC pulse interrupted ground fault signal being substantially a square wave, and a magnetic sensor for location relative to the DC system for sensing said magnetic field changes and thereby said DC pulse interrupted ground fault signal and thereby providing for detecting the location of the low level ground leakage current in the relatively high capacitive reactance system, said DC system remaining substantially closed and operational during the ground leakage current detection, the pulse interruption rate being between about 2 to about 6 cycles per second.

24. A method of detecting low level ground leakage current in a normally ungrounded DC system in a multifeeder distribution system having a relatively high capacitive reactance and being associated with a relatively strong electromagnetic and electrostatic field, said system including a DC power supply, conductors from the supply for supplying power to a load connected in the DC system comprising the steps of connecting a resistor across the DC power supply, connecting an indicator between a tapping point relative to the resistor and a ground point such that a ground leakage current in the system closes a ground circuit to activate the indicator means, periodically interrupting said circuit by opening and closing the ground circuit effectively to generate a DC pulse interrupted ground fault signal being substantially a square wave to produce proportional periodic changes in a magnetic field associated with the system while the ungrounded DC system remains substantially operational, and magnetically sensing in a location relative the DC system said magnetic field changes related to said pulse interrupted ground fault signal whereby said magnetic field changes provide the necessary signal for low level ground fault current detection, the pulse interruption rate being between about 2 to about 6 cycles per second.

* * * * *

UNITED STATES PATENT AND TRADEMARK OFFICE
CERTIFICATE OF CORRECTION

PATENT NO. : 4,739,274

DATED : 4/19/88

INVENTOR(S) : KIMBALL ET AL.

It is certified that error appears in the above-identified patent and that said Letters Patent is hereby corrected as shown below:

In the drawing, sheet 1, Figure 1, in the block designated 22, the legend should read "PULSER = 2 CPS"; and Sheet 2, Figure 2, in the block designated 45, the legend should read "PULSE EDGE DETECTOR".

In the specification, column 3, line 14, delete "24" and insert -- 25 --; and column 4, line 45, delete "64" and insert -- 164 --.

Signed and Sealed this

Thirteenth Day of December, 1988

Attest:

DONALD J. QUIGG

Attesting Officer

Commissioner of Patents and Trademarks